United States Patent [19]

Sroka et al.

[11] Patent Number: 5,778,308
[45] Date of Patent: Jul. 7, 1998

[54] ADAPTIVE ANTENNA MATCHING

[75] Inventors: Peter Sroka, Woking; John Anthony Samuels, Camberley, both of England

[73] Assignee: Nokia Mobile Phones Limited, Salo, Finland

[21] Appl. No.: 773,280

[22] Filed: Dec. 26, 1996

Related U.S. Application Data

[63] Continuation of Ser. No. 449,719, May 24, 1995, abandoned.

[30] Foreign Application Priority Data

May 25, 1994 [GB] United Kingdom .................. 9410513

[51] Int. Cl.$^6$ ........................................... H04B 17/00
[52] U.S. Cl. ................... 455/115; 455/126; 333/17.3; 333/32
[58] Field of Search ................... 455/115–116, 126–127, 455/121–124, 128–129, 107, 114, 117, 125, 78, 83, 575; 330/298, 207 P; 324/646, 642; 343/703, 860, 861, 745, 850; 333/17.3, 32

[56] References Cited

U.S. PATENT DOCUMENTS

| | | | |
|---|---|---|---|
| 3,718,873 | 2/1973 | Garver | 333/32 |
| 3,842,358 | 10/1974 | Frazier | 455/115 |
| 4,015,223 | 3/1977 | Cheze | 333/32 |
| 4,493,112 | 1/1985 | Bruene | 455/123 |
| 4,584,650 | 4/1986 | Kozuch | 455/115 |
| 4,859,967 | 8/1989 | Swanson | 455/117 |
| 4,965,607 | 10/1990 | Wilkins et al. | 455/123 |
| 5,361,403 | 11/1994 | Dent | 455/126 |
| 5,483,680 | 1/1996 | Talbot | 455/125 |
| 5,564,086 | 10/1996 | Cygan et al. | 333/17.3 |

FOREIGN PATENT DOCUMENTS

| | | |
|---|---|---|
| 0210746 | 2/1987 | European Pat. Off. |
| 1517143 | 7/1978 | United Kingdom . |
| 1519672 | 8/1978 | United Kingdom . |
| 2219457 | 12/1989 | United Kingdom . |
| WO 88/08645 | 11/1988 | WIPO . |

*Primary Examiner*—Nguyen Vo
*Attorney, Agent, or Firm*—Perman & Green, LLP

[57] ABSTRACT

In a mobile radio telephone, an adaptive impedance matching circuit (25) is positioned between a transmitting power amplifier (24) and a duplexer (18). The adaptive matching circuit (25) matches an antenna (17) to associated electronic circuitry, thereby optimising power transfer in an effort to maintain communication with a base station and to minimise power dissipation within the device itself. An adaptation algorithm is selected and implemented during idle periods when a reflection coefficient is identified as being large. The reactance of a passive pi network is incrementally modified and settings which achieve an optimum match are stored for subsequent use.

28 Claims, 3 Drawing Sheets

ADAPTIVE ANTENNA MATCHING

This is a continuation of application Ser. No. 08/449,719 filed on May 24, 1995, abandoned.

BACKGROUND OF THE INVENTION

The present invention relates to an adaptive antenna matching network, in which variations to antenna impedance are matched, so as to effect improved levels of power transfer.

In a radio communications device, an antenna is responsible for effecting conversions between electromagnetic signals and electrical signals. Electrical signals having a frequency high enough to be radiated in this way are usually identified as "radio frequency" (RF) signals and it is well known in the art that care must be taken when transmitting and processing signals of this type, given their inherent ability to be re-radiated.

An important parameter to consider, when designing an antenna, is characteristic impedance and in order to effect maximum power transfer between an antenna and, circuitry connected thereto, it is important to ensure that the characteristic impedance of the antenna is matched by the characteristic impedance of the associated circuitry. In practice, circuitry will be designed to present the required impedance to the antenna which, in theory, should achieve maximum power transfer. However, the characteristic impedance of the antenna will also vary with operating conditions. For example, mobile cellular telephones are often placed on table tops, close to a vehicle facia and, when in operation, close to a user. Each of these positions will result in modifications being made to the characteristic impedance of the antenna which may interfere with the normal operation of the telephone to a greater or lesser extent.

When a mis-match occurs between the characteristic impedance of an antenna and the impedance of associated circuitry, the transfer of power between these two devices will be less than optimum. Thus, while transmitting, signals generated by an output power amplifier will be supplied to the antenna. However, given that a mis-match is present, not all of the signal power will be transmitted by the antenna and a proportion will be reflected back to the amplifier. Similarly, when receiving signals, not all of the signal power will be transferred from the antenna to receiving circuitry and some of it will be reflected back to the antenna, again resulting in less than optimum power transfer between the antenna and the associated circuitry. Also, the non-optimal match between amplifier and antenna can result in reduced performance of the amplifier. This may affect its linearity, efficiency and other key parameters.

It is accepted that, during normal operation, variations will occur to the actual operating impedance of the antenna. Thus, in order to overcome these variations in impedance, it is possible to provide an adaptive antenna matching network which compensates for these variations. A network of this type is disclosed in international patent publication number WO 88/05214. In accordance with this disclosure, a system monitors the signal strength of an incoming signal, primarily to provide a visual indication of signal strength as is well known in the art. In addition, this signal strength level is also used to adapt an adaptive network arranged to compensate for variations in antenna impedance. Thus, in accordance with the disclosure, if a reduction in signal strength is identified, it is assumed that this reduction is due to antenna mis-match and procedures are implemented in order to improve the matching characteristics of the antenna.

A problem with the above disclosure is that adaptations of the antenna matching network may be effected in response to reductions in signal strength, when said reductions occur due to reasons other than antenna mis-match. Consequently, adaptations may be made which, at best, do not improve transmission characteristics and at worst may make the transmission characteristics worse. Thus, a situation in which signal strength is decreasing, resulting in impaired transmission, may then effect adaptations to the matching circuit which in turn worsen the transmission characteristics which, in a worst case scenario, may result in the loss of transmission.

SUMMARY OF THE INVENTION

It is an object of the present invention to provide an improved adaptive antenna matching network.

According to an aspect of the present invention, there is provided an adaptive antenna matching network in which the impedance of said matching network is adjusted in response to the operating environment of the antenna comprising means for directly measuring the level of reflected signals and means responsive thereto for adjusting the impedance of the matching network.

Thus, in the present invention, adaptation is controlled directly in response to the level of signals being reflected due directly to antenna mis-match. Thus, modifications or adaptations will not occur if, for example, the signal strength is reduced due to other causes.

BRIEF DESCRIPTION OF THE DRAWINGS

The invention will now be described by way of example only, with reference to the accompanying drawings, in which.

DETAILED DESCRIPTION OF THE INVENTION

Figure 1:
FIG. 1 shows a mobile radio cellular telephone communicating with a base station.

A radio cellular telephone unit 15 is shown in FIG. 1 communicating with a base station 16. The radio telephone unit is of a TDMA type, wherein data is transmitted during allotted time slots. Furthermore, idle periods are available, during which the telephone is neither transmitting nor receiving.

The telephone unit is arranged to communicate with one of a plurality of base stations, such as base station 16, depending upon its geographical location. Furthermore, during said idle time, the telephone will investigate whether it can obtain improved communication with another base station, usually due to a telephone unit being moved into an adjacent cell, whereupon communication with the previous base station will be terminated and reinstated with the base station providing clearer transmission characteristics.

Transmitted signals and received signals are further separated from each other by frequency-division multiplex. Thus, out-going signals are transmitted in time slots having a carrier of a first frequency, while in-coming signals are received on a carrier of a different frequency. In this way, an antenna 17 may be used for both transmission and reception, with frequency-sensitive circuits being provided to effect a duplexing function.

Figure 2:
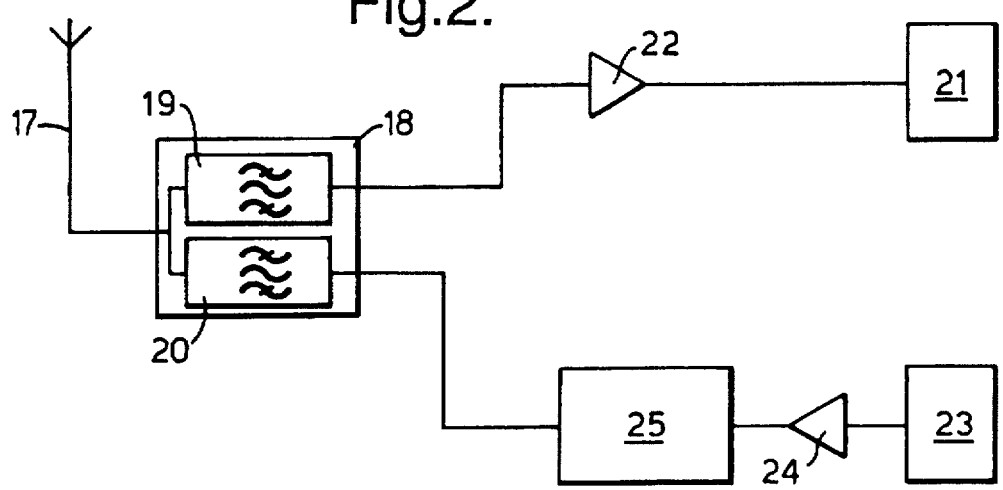
FIG. 2 details circuitry within the mobile telephone shown in FIG. 1, including an adaptive antenna matching network.

The radio telephone unit 15 shown in FIG. 1 is detailed in FIG. 2. Antenna 17 is connected to a duplexing circuit 18, essentially containing a first band pass filter 19 and a second band pass filter 20. Signals received by the antenna 17 are allowed to pass through band pass filter 19 and are, in turn, supplied to an input processing circuit 21 via an input amplifier 22. Similarly, an output circuit 23 generates signals which are supplied to the antenna 17, via an output power amplifier 24, an adaptive antenna matching network 25 and the output band pass filter 20.

In this embodiment, antenna matching is effected by considering signals which are being transmitted by the radio telephone. In alternative embodiments, the adaptive antenna matching network or an additional matching network, could be provided between input band pass filter 19 and input amplifier 22. However, it should be appreciated that significantly higher signal levels are available in the transmission path, in preference to the reception path. In another alternative embodiment, the adaptive antenna matching circuit 25 may be provided between the antenna 17 and the duplexer 18, allowing adaptation to be effected in response to both transmitted and received signals. However, as previously stated, in the preferred embodiment detailed subsequently, the adaptive antenna matching network 25 is provided between the output amplifier 24 and the duplexer 18.

Figure 3A:
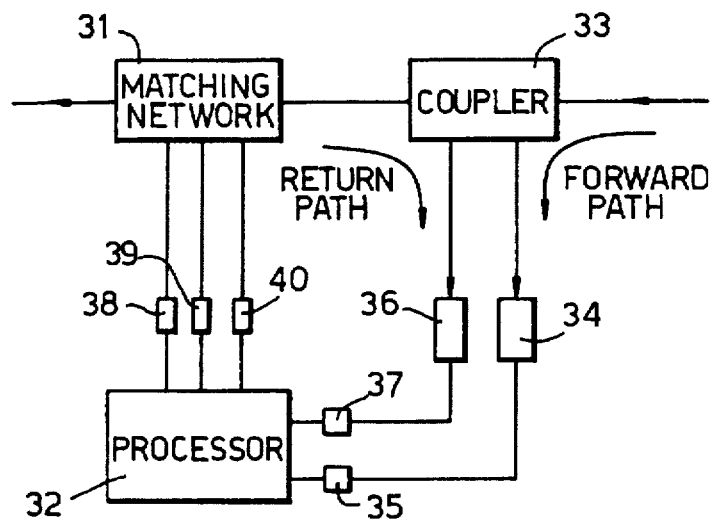
FIGS. 3A–3C detail examples of the adaptive antenna matching circuits shown in FIG. 2, each including a matching network.

The adaptive antenna matching network 25 is detailed in FIG. 3A. Impedance matching is effected by means of an adaptable passive matching network 31 of passive, variable-reactance components, which is adapted in response to signals received from a digital processor 32. Output signals from the output power amplifier 24 are supplied to the matching circuit 31 via a coupler 33, arranged to direct a proportion of said signals to processor 32, via a detector 34 and an analog-to-digital converter 35. Detector 34 essentially consists of a diode and is arranged to generate a voltage proportional to the power of the signal received from the coupler 33. This voltage is in turn supplied to the analog to digital converter 35, arranged to supply a digital representation of said voltage to the processor 32. Thus, the coupler 33, the detector 34 and the analog-to-digital converter 35 provide a digital indication to the processor 32 of the power of the forward transmission signals supplied to the antenna. As the radio telephone typically determines the transmission level a digital indication of the transmission level could be provided without direct measurement being necessary.

Figure 3B:
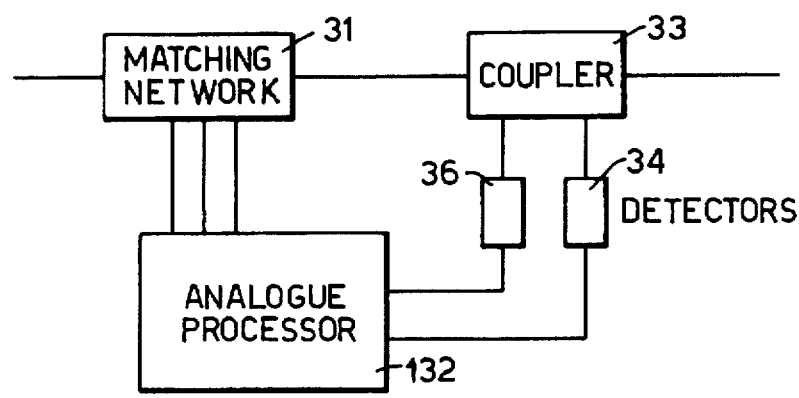
Figure 3C:
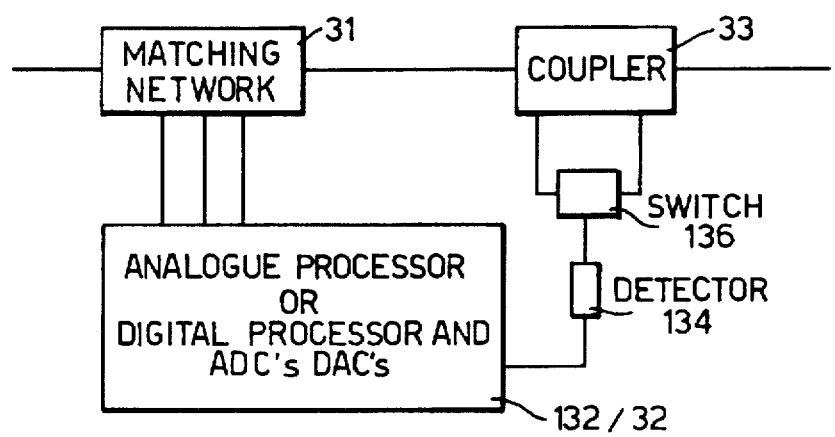

An analogue processor could be used instead of the digital processor 32. In this case no A/D converters 35, 37 would be necessary. See FIG. 3B. As a further option, a single detector 134 could replace the two detectors 34, 36. A switch 136 would then be provided to enable forward and reverse waves to be individually sampled. See FIG. 3C. This arrangement could be implemented with an analogue or with a digital processor 132. The processor would sample the forward wave in order to determine the transmitted output power and then measure the reverse wave, in response to alteration of the matching network.

If, as previously stated, there is an impedance mismatch between the antenna 17 and the cooperating circuitry, a proportion of the out-going signal supplied to the antenna 17 will be reflected back to the associated circuitry. Thus, in addition to forward-path signals being transmitted through coupler 33 from its right side to its left side and thereafter on to the antenna, signals will also be reflected back from the antenna and pass through coupler 33 from its left side to its right side. The coupler 33 is arranged to direct a proportion of these return-path signals to the processor 32, via a second detector 36, substantially similar to the first detector 34, and a second analog to digital converter 37, substantially similar to the first analogue to digital converter 35. Thus, in addition to receiving a digital indication of the strength of the forward path signal, during transmission, processor 32 is also provided with a digital representation of the signal strength in the return path. Thereafter, having received indications of signal strength for both the forward path and the return path, the processor 32 may calculate the proportion of the forward path signal which is being reflected back from the antenna and returned to the coupler 33. In response to receiving these two indications, the processor 32, is arranged to divide a value representing the returned signal strength by the value representing the forward signal strength, to produce a value which may be identified as a power reflection coefficient. The value representing the forward signal strength may be the transmitted signal level or may be some other measure of the transmitted signal. The purpose of the matching network 31 is to reduce the value of the reflection coefficient. Thus, the processor 32 is arranged to make modifications to the operating characteristics of the matching network 31, recalculate the reflection coefficient, compare the new reflection coefficient against previous reflection coefficients and, in response to said comparisons, make further modifications to the matching network 31.

Figure 4:
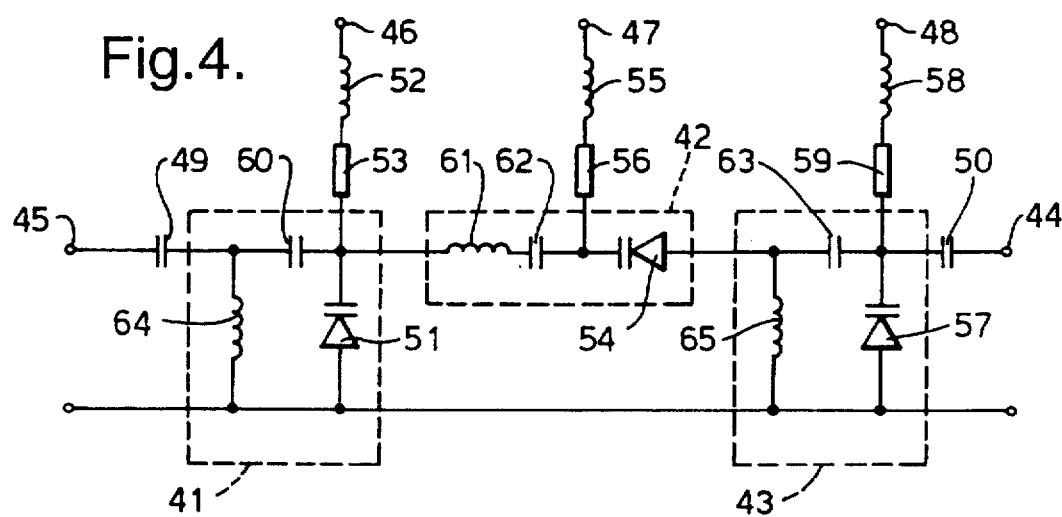
FIG. 4 details the matching network shown in FIGS. 3A–3C.

The matching network 31 is detailed in FIG. 4. and includes a first variable-reactance circuit 41, a second variable-reactance circuit 42 and a third variable-reactance circuit 43. A first port 44 provides an input port in the forward direction and an output port in the return direction. Similarly, a second port 45 provides an output port in the forward direction and an input port in the return direction. The variable-reactance circuits, 41, 42 and 43 are configured in a pi network. A tee network could, however, be used instead. Each variable-reactance circuit 41, 42, 43 is arranged to receive a respective control signal from control ports 46, 47 and 48 respectively. The processor 32 generates digital control signals, which are converted to analog control signals by analog-to-digital converters 38, 39 and 40, which supply control signals to ports 46, 47 and 48 respectively. If an analogue processor is used A/D converters 38, 39 and 40 are not necessary.

Signal port 45 is dc isolated from variable-reactance circuit 41 by means of a dc de-coupling capacitor 49. Similarly, the capacitor 50 dc isolates signal port 44 from the variable-reactance circuit 43. A control signal applied to control port 46 applies a bias to a varactor diode 51, thereby adjusting the capacitance of said device, via an inductor 52 and a resistor 53. A similar varactor diode 54 is controlled by control signals supplied to port 47 via an inductor 55 and resistor 56. Similarly, a varactor diode 57 receives control signals supplied to control port 48 via an inductor 58 and a serially-connected resistor 59.

As clearly shown in FIG. 4, capacitor 49 is in series with a capacitor 60, which is in turn in series with an inductor 61, a capacitor 62 and varactor diode 54. On the other side of said varactor diode, a serial connection is made with a further capacitor 63 which is itself in series with capacitor 50. The interconnection between capacitors 49 and 60 is connected to ground by an inductor 64. A similar inductor 65 connects the interconnection between varactor diode 54 and capacitor 63 to ground.

Each variable-reactance circuit 41, 42 and 43 is arranged so that, in response to a suitable signal being supplied to its respective control port 46, 47 or 48, it may be made resonant and, thereby effectively transparent. Furthermore, control signals may be supplied to said control ports so as to render their respective reactance circuits either capacitive or inductive. Thus, by applying suitable control signals to said control ports, it is possible to adjust the overall reactance of the circuit shown in FIG. 4 so as to compensate for most reasonable variations which may occur to the characteristic impedance of the antenna. Furthermore, the circuitry shown in FIG. 3 may include means by which a warning signal may be generated if the characteristic impedance of the antenna has changed so greatly that it is impossible for the circuit shown in FIG. 4 to actually compensate for this variation. Such a variation may occur if, for example, damage has occurred to the antenna.

Modifications to individual reactance circuits shown in FIG. 4 may be represented as loci on Smith charts and reference may be made to the standard texts in this area for further details. However, suffice to say for the purposes of the present disclosure, the three reactive circuits provide sufficient degrees of freedom for all practical variations in characteristic impedance of the antenna to be compensated for and, by making appropriate adjustments, it should be possible to achieve a satisfactory match between the antenna and its associated circuitry.

Compensation is achieved by making one of the parallel reactive circuits, either circuit 41 or circuit 43, resonate; that is to say, making it effectively transparent from an impedance point of view. Thereafter, the serial circuit 42 is set to be either capacitive or inductive, i.e., at a predetermined reactance value, and thereafter modifications are made to the reactance of the other parallel circuit over a range of capacitive and inductive values, whereafter the optimum value for said circuit is selected. These adjustments can be made incrementally.

The operation of the circuit shown in FIG. 4 during adaptation is illustrated in FIGS. 5a, 5b, 5c and 5d. In the preferred embodiment, adaptations are made during idle periods, so that impedance values which result in a mismatch being made worse will not actually affect transmission characteristics. In alternative embodiments where transmission occurs continuously, for example in analog systems, modifications may be made extremely quickly, thereby not effecting transmission to a noticeable degree or, alternatively, modifications may be made over a limited range so as to minimise detrimental effects.

In the preferred embodiment, it is not necessary to effect the adaptation algorithm during each idle period. For example, the adaptation algorithm may be called once every 0.5 seconds or after whatever other interval is found to be appropriate. An advantage of this approach is that idle periods may be used for other functions, under the control of suitable processor software.

In the preferred embodiment, the adaptation algorithm is called by the main control processor 32 resident within the mobile telephone. However, in an alternative embodiment, the matching network is provided as an add-on device 70 (FIG. 1), possibly as part of a booster device, wherein the adaptation algorithm is effected by the device's own resident processor.

In order to effect the adaptation algorithm, a signal is transmitted resulting in the forward path signal strength being measured and compared with the return path signal strength. A low output power would be desirable so as to not reduce the battery life significantly or effect the adaptation algorithm during transmission. Preferably measurement of the signal strength takes place during transmission as is the case for an analogue system. Measurement could, however, be effected in the 'dead time' before transmission.

Dividing the return signal path strength with the forward signal path strength results in a calculation of the reflection coefficient and an assessment is made of this coefficient to determine whether adaptation of the matching network 31 is required. If the reflection coefficient is identified as being suitably small, it is assumed that antenna matching is good enough and no further adaptation of network 31 is effected. If, on the other hand, the reflection coefficient is larger than the second predetermined value identifying extreme antenna mismatch, an alarm may be raised and, again, no further action taken with respect to the adaptation of matching network 31. However, if the reflection coefficient lies in a range which is greater than a first predetermined value and less than said second predetermined value, the adaptation algorithm is effected in attempt to improve matching between the antenna and its associated circuitry.

The adaptation algorithm assumes values for control signals supplied to control ports 46, 47 and 48. These values are stored in registers as the "best so far" values which, over the course of the adaptation algorithm, may be modified if the reflection coefficient has been improved i.e., reduced.

The adaptation algorithm is initiated by making circuit 43 resonant, circuit 42 capacitive and adjusting circuit 41 over a range of capacitive and inductive values. This configuration is shown in simplified form in FIG. 5a. Thus, circuit 43 is now effectively transparent and circuit 42 assumes the role of a capacitor. Circuit 41 is now adjusted to its maximum capacitive value and the registers are loaded with signals representing the values supplied to the control ports as the "best so far" values.

It will be appreciated that some modification may actually make matters worse but, over the course of the adaptation algorithm, better "best so far" values shall be identified. The algorithm continues by adjusting the reactance of circuit 41, making it less capacitive and more inductive in predetermined increments. After each adjustment, the reflection coefficient is considered to determine whether the adjustment has resulted in an improvement, compared to the stored "best so far" condition. If an improvement has been made, the "best so far" values are replaced and the present values stored as the new "best so far" values. Thus, this procedure is repeated for each incremental value of reactance for circuit 41, extending from its maximum capacitive value to its maximum inductive value.

Figure 5A:
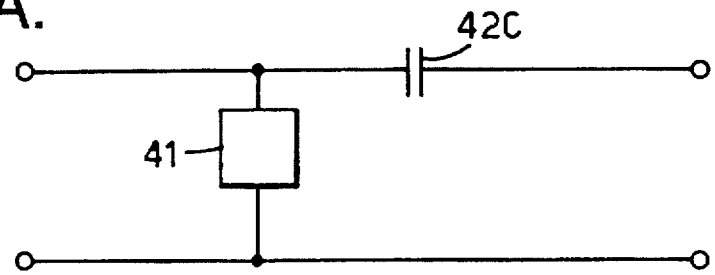
FIGS. 5A–5D shows some examples of equivalent circuits for the matching networks shown in FIG. 4, under different operating conditions.
Figure 5B:
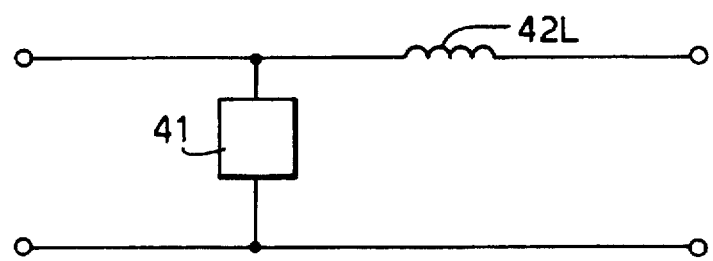

As shown in FIG. 5b, this procedure is now repeated with device 42 being made inductive. Thus, after device 42 has been made inductive, the reactance of device 41 is adjusted to its maximum capacitive value and incremented in predetermined steps until it reaches its maximum inductive value. At each stage, the reflection coefficient is compared with the "best so far" value and, if found to be better, the control signal registers are updated.

Figure 5C:
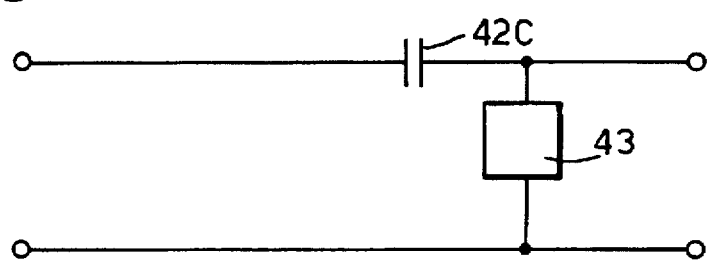

As shown in FIG. 5c, this procedure is repeated with device 42 being made capacitive again, identified as 42C with sweeping adjustments being made to the reactance of circuit 43. Thus, circuit 43, is adjusted to its maximum capacitive value and thereafter adjusted in predetermined increments until it reaches its maximum inductive value. At each stage, the reflection coefficient is compared with the "best so far" value and, if appropriate, the registers are updated.

Figure 5D:
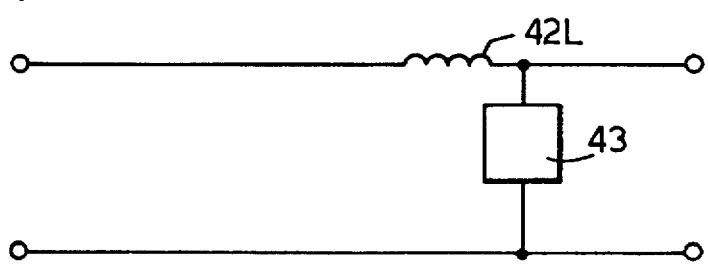

A final adaptation procedure is identified in FIG. 5d. Thus, device 42 is again made inductive, identified as 42L and the reactance of device 43 is swept from its maximum capacitive value to its maximum inductive value in predetermined increments. At each stage, the "best so far" value is compared with the stored value and updated as appropriate.

Thus, it can be appreciated that during the adaptation process, all possible values are considered and in many occurrences, the actual matching of the antenna to its associated circuitry will be made a great deal worse than that before the adaptation process was commenced. However, given that this adaptation occurs during the idle periods, this does not adversely affect overall transmission characteristics. At each stage, the reflection coefficient is compared with the "best so far" value and if a better value is found for the control signals, the registers are overwritten with these said values. Thus, after completing the adaptation algorithm, the best possible settings for the control signals will have been determined, whereafter they will be automatically read from the registers and selected as the new values for application to the control ports during the transmission and reception periods.

What is claimed is:

1. An adaptive antenna-matching network for a radiotelephone, said network comprising:
    first and second reactive circuits interconnected by a third reactive circuit, wherein each of said first and said second reactive circuits comprises a shunt element, and said third reactive circuit comprises a series reactance operative for reversal between capacitive and inductive values of reactance;
    means responsive to the operating environment of the radiotelephone for directly measuring the level of reflected signals produced by the radio telephone's environment;
    means responsive to said level of reflected signals for electronically adjusting the impedances of individual ones of said reactive circuits of the matching network;
    wherein said measuring means and said adjusting means are operative to effect repetitive measurements of the reflected signals and repetitive adjustments of the impedance.

2. An adaptive antenna-matching network according to claim 1, wherein said matching network is adjusted in response to the level of transmitted signals relative to said level of reflected signals.

3. A matching network according to claim 2, wherein said matching network is adjusted in response to the level of a reflection coefficient, calculated by dividing said reflected signal level by said transmitted signal level.

4. An adaptive antenna-matching network according to claim 1, wherein said matching network is also adjusted in response to a direct measurement of the level of transmitted signals.

5. An adaptive antenna-matching network according to claim 1 wherein the means for adjusting is responsive to an indication that the reflected signals meet predetermined level criteria.

6. An adaptive antenna-matching network according to claim 5 wherein the means for adjusting comprises means for comparing the impedance match obtained by an adjustment with a previously recorded best impedance match, if the adjusted impedance match is better, the recorded best impedance match is replaced with the adjusted match.

7. An adaptive antenna-matching network according to claim 6 wherein the impedance match reverts to the recorded best impedance match between adjustments.

8. A network according to claim 1, wherein said level of reflected signal is measured by coupling means.

9. A network according to claim 1, wherein reflected signals are reflected from an antenna back towards transmitting circuitry.

10. A network according to claim 9, wherein said transmitting circuitry forms part of a hand-held mobile radio telephone.

11. A network according to claim 9, wherein said transmitting circuitry forms part of a booster device unit operations as part of a mobile radio telephone unit.

12. A matching network according to claim 1, wherein each of a plurality of said reactive circuits includes a passive variable-reactance component.

13. A matching network according to claim 1 wherein said reactive circuits are interconnected as a pi or Tee network.

14. The network of claim 1, wherein said impedance is adjusted without reference to direct measurement of the level of transmitted signals.

15. The network of claim 14 wherein said radiotelephone has a processing signal controlling adjustment of said impedance.

16. An adaptive antenna-matching network according to claim 1 wherein said measuring means and said adjusting means are operative to effect said repetitive measurements of the reflected signals and said repetitive adjustments of the impedance during intervals of a radiotelephonic communication.

17. An adaptive antenna-matching network according to claim 16 wherein said intervals of a radiotelephonic communication are idle periods.

18. An antenna-matching method for radiotelephones having an antenna-matching network, comprising the steps of:
    providing in said network first and second reactive circuits interconnected by a third reactive circuit, wherein each of said first and said second reactive circuits comprises a shunt element, and said third reactive circuit comprises a series reactance operative for reversal between capacitive and inductive values of reactance;
    measuring a level of reflected signals produced by the environment of a radiotelephone; and
    electronically adjusting an impedance of the matching network;
    wherein said adjusting step comprises steps of:
    electronically setting the reactance for said first reactive circuit in resonance when power is transmitted to the antenna;
    electronically setting said series reactance of said third reactive circuit in the network to a first predetermined reactance value;
    electronically adjusting the reactance of said second reactive circuit in the network over a range of reactive values; and
    selecting the optimum value for said second reactive circuit.

19. The method of claim 18 further comprises the steps of:
    determining the reflection coefficient produced by said antenna matching network; and
    discontinuing said antenna matching when said reflection coefficient exceeds a predetermined value.

20. The method of claim 18 wherein when said adjustment is made during transmission, said range is restricted so as to minimize the detrimental effects of said adjustment.

21. The method of claim 18 wherein, when said adjustment is made during transmission, said adjusting and selecting steps are done extremely quickly so as to minimize the detrimental effects of said adjustment.

22. The method of claim 18 wherein said method is initiated at a predetermined interval.

23. An antenna-matching method for radiotelephones having an antenna-matching network, comprising the steps of:

measuring a level of reflected signals produced by the environment of a radiotelephone; and electronically adjusting an impedance of the matching network;

wherein said adjusting step comprises steps of:

electronically setting the reactance for a first parallel reactive circuit in the network resonance when power is transmitted to the antenna;

electronically setting a series reactance circuit in the network to a first predetermined reactance value;

electronically adjusting the reactance of a second parallel reactive circuit in the network over a range of reactive values; and selecting the optimum value for said second parallel reactive circuit;

the method further comprising the steps of reversing the reactance of said series circuit from capacitive to inductive or vice versa after selecting said first optimum values;

repeating said steps of adjusting said second parallel reactive circuit and selecting a second optimum value thereby; and selecting an optimum value providing the best reflection coefficient from said first and said second optimum values.

24. An adaptive antenna-matching network for a radiotelephone, said network comprising:

first and second reactive circuits interconnected by a third reactive circuit, wherein each of said first and said second reactive circuits comprises a shunt element, and said third reactive circuit comprises a series reactance operative for reversal between capacitive and inductive values of reactance;

means responsive to the operating environment of the radiotelephone for directly measuring the level of reflected signals produced by the radio telephone's environment;

means responsive to said level of reflected signals for electronically adjusting the impedances of individual ones of said reactive circuits of the matching network.

25. An adaptive antenna-matching network for a radiotelephone, said network comprising:

a first reactive circuit having a shunt reactance and a second reactive circuit having a series reactance, said shunt reactance having a frequency-selectable resonance, and said series reactance being operative for reversal between capacitive and inductive values of reactance;

means responsive to the operating environment of the radiotelephone for directly measuring the level of reflected signals produced by the radio telephone's environment; and means responsive to said level of reflected signals for electronically adjusting the impedances of individual ones of said reactive circuits of the matching network.

26. An adaptive antenna-matching network for a radiotelephone, said network comprising:

first and second reactive circuits interconnected by a third reactive circuit, wherein each of said first and said second reactive circuits comprise a shunt reactance, and said third reactive circuit comprises a series reactance, one of said first and said second reactance circuits being operative to become transparent to a signal propagating through said antenna-matching network;

means responsive to the operating environment of the radiotelephone for directly measuring the level of reflected signals produced by the radio telephone's environment; and means responsive to said level of reflected signals for electronically adjusting the impedances of individual ones of said reactive circuits of the matching network.

27. An antenna-matching method for radiotelephones having an antenna-matching network, comprising the steps of:

providing in said network a first reactive circuit having a shunt reactance and a second reactive circuit having a series reactance, said shunt reactance having a frequency-selectable resonance, and said series reactance being operative for reversal between capacitive and inductive values of reactance;

measuring a level of reflected signals produced by the environment of a radiotelephone; and electronically adjusting an impedance of the matching network;

wherein said adjusting step comprises steps of:

electronically setting the reactance for said first reactive circuit in resonance when power is transmitted to the antenna;

electronically setting said series reactance of said second reactive circuit in the network to a first predetermined reactance value;

electronically adjusting the reactance of said first reactive circuit in the network over a range of reactive values; and selecting the optimum value for said first reactive circuit.

28. An antenna-matching method for radiotelephones having an antenna-matching network, comprising the steps of:

providing in said network first and second reactive circuits interconnected by a third reactive circuit, wherein each of said first and said second reactive circuits comprise a shunt reactance, and said third reactive circuit comprises a series reactance, one of said first and said second reactance circuits being operative to become transparent to a signal propagating through said antenna-matching network;

measuring a level of reflected signals produced by the environment of a radiotelephone; and electronically adjusting an impedance of the matching network;

wherein said adjusting step comprises steps of:

electronically setting the reactance for said first reactive circuit in resonance when power is transmitted to the antenna;

electronically setting said series reactance of said third reactive circuit in the network to a first predetermined reactance value;

electronically adjusting the reactance of said second reactive circuit in the network over a range of reactive values; and selecting the optimum value for said second reactive circuit.

* * * * *